United States Patent
Avram et al.

(10) Patent No.: US 7,538,548 B2
(45) Date of Patent: May 26, 2009

(54) FAST SPIN ECHO MRI METHOD COMPATIBLE WITH CPMG VIOLATION

(75) Inventors: Hector E. Avram, Foster City, CA (US); James D. Hale, Berkeley, CA (US); Ilya Simovsky, Redwood City, CA (US); David M. Kramer, Corte Madera, CA (US)

(73) Assignee: Toshiba Medical Systems Corp., Otawara-Shi (JP)

( * ) Notice: Subject to any disclaimer, the term of this patent is extended or adjusted under 35 U.S.C. 154(b) by 194 days.

(21) Appl. No.: 11/420,224

(22) Filed: May 25, 2006

(65) Prior Publication Data

US 2008/0009701 A1 Jan. 10, 2008

(51) Int. Cl.
*G01V 3/00* (2006.01)
(52) U.S. Cl. ..................................... 324/307
(58) Field of Classification Search ................. 324/307
See application file for complete search history.

(56) References Cited

U.S. PATENT DOCUMENTS

| | | | | |
|---|---|---|---|---|
| 5,229,717 A * | 7/1993 | Hinks | ......................... | 324/309 |
| 5,833,609 A * | 11/1998 | Dannels et al. | ............. | 600/410 |
| 6,265,873 B1 * | 7/2001 | Le Roux | ..................... | 324/309 |
| 6,611,143 B2 * | 8/2003 | Kuhara | ....................... | 324/307 |
| 6,882,148 B2 * | 4/2005 | Pipe | ........................... | 324/307 |
| 7,030,609 B2 * | 4/2006 | Pipe | ........................... | 324/309 |

OTHER PUBLICATIONS

Bastin, M.E. et al, Application of Non-CPMG Fast-Spin-Echo Sequences to MR Diffusion Imaging, Proceedings for the International Society of Magnetic Resonance in Medicine, 9th Annual Scientific Meeting and Exhibition, 2001, Glasgow, Scotland, UK, p. 1549.*

* cited by examiner

*Primary Examiner*—Brij B. Shrivastav
*Assistant Examiner*—Megann E Vaughn
(74) *Attorney, Agent, or Firm*—Watchstone P+D, pllc; Stephen B. Parker (57) ABSTRACT

In preferred embodiments, a fast spin echo imaging technique is provided that is insensitive to violations of the Carr Purcell Meiboom Gill (CPMG) condition. Diffusion gradients disrupt the CPMG condition, and, hence, the present fast spin echo method is compatible with diffusion measurements and diffusion weighted imaging. The preferred embodiments of the present technique involve splitting of spin echoes into echo pairs. Spin echoes are split by adjustment (in magnitude or duration) of an initial readout gradient pulse. A train of echo pairs is captured. A first image is constructed using the first echoes of each pair. Also, a second image is constructed using the second echoes of each pair. Hybrid radial Cartesian methods are used for constructing the first and second images. The first and second images are constructed independently of one another. Independent image construction renders the method insensitive to violation of the CPMG condition. Finally, the two images are combined to form a final image.

19 Claims, 5 Drawing Sheets

FAST SPIN ECHO MRI METHOD COMPATIBLE WITH CPMG VIOLATION

BACKGROUND

1. Field of the Invention

The present invention relates generally to magnetic resonance imaging. More specifically, the preferred embodiments of the present invention provide a magnetic resonance imaging method employing a fast spin echo technique in combination with hybrid radial-Cartesian image reconstruction. The present fast spin echo imaging technique of the preferred embodiments does not require the Carr Purcell Meiboom Gill (CPMG) condition. Among other things, the preferred embodiments of the present invention are particularly well suited for use with diffusion-weighted MRI imaging.

2. Background Discussion

Magnetic Resonance Imaging (MRI) is a widely accepted and commercially available technique for obtaining digitized visual images representing the internal structure of objects having substantial populations of atomic nuclei that are susceptible to nuclear magnetic resonance (NMR). In MRI, imposing a strong main magnetic field ($B_0$) on the nuclei polarizes nuclei in the object to be imaged. The nuclei are excited by a radio frequency (RF) signal at characteristic NMR (Larmor) frequencies. By spatially distributing localized magnetic fields surrounding the object and analyzing the resulting RF responses from the nuclei, a map or image of these nuclei responses as a function of their spatial location is generated and displayed. An image of the nuclei responses provides a non-invasive view of an objects internal structure.

MRI machines are costly. Therefore, it is desirable to minimize the amount of scanning time required to create an image, while maintaining image quality (e.g. contrast, resolution and signal-to-noise ratio). So-called "fast spin echo" techniques are commonly used to minimize scan time while creating MRI images of acceptable quality. There exist a number of fast spin echo techniques. Fast spin echo imaging typically uses multiple spin echoes (an 'echo train') generated after a single excitation pulse.

In modern MRI methods, diffusion weighted imaging is commonly performed. In diffusion weighted imaging, the rate of diffusion of, e.g., water is measured in the imaged slice. Diffusion weighting improves the MRI image contrast, and provides additional useful information, as well known in the art.

Unfortunately, diffusion weighted imaging requires very powerful magnetic field gradient pulses which create difficulties when combined with fast spin echo imaging methods.

Specifically, fast spin echo methods are sensitive to the initial phase of the echo signal. The well-known Carr Purcell Meiboom Gill (CPMG) condition is generally required in order to perform fast spin echo imaging. Diffusion pulses disrupt the CPMG condition and distort the critical phase information, particularly when the diffusion pulses are applied before imaging. Consequently, diffusion weighted imaging is disruptive to fast spin echo imaging.

The CPMG condition is simple to implement: The radiofrequency (RF) phase of all refocusing RF pulses (180° pulses) need to be the same and at the same time 90° with respect to the RF phase of the excitation pulse (90° pulse). The first part of the diffusion gradient pulse pair is applied before the 180° pulses where remnants of unsettled gradients (eddy currents fields) and/or motion can cause unwanted phase errors, particularly between the excitation pulse and first refocusing pulse. This initial phase can be any value and introduces an error in the CPMG condition causing signal loss and imaging artifacts as was mentioned above.

The signal that arises in a fast spin echo train has a large number of contributions from signals generated on different so-called pathways. The number of signals can become large for later echoes and they both reinforce and cancel one another in the CPMG case. One of the effects caused by the loss of CPMG condition is that these signals no longer line up precisely in synch with each other. Consequently, the signals beat against each other and create image artifacts. One approach to removing these artifacts is to sacrifice half of the signal. This is done by tuning the diffusion gradient pulses such that the signals segregate into a pair of conditions. Then, one of the pair is 'spoiled', and the other is retained for use in generating the image. This has the advantage of making the signal very stable but at a high cost in signal strength. A MRI method that is insensitive to violation of the CPMG condition is described in *SPLICE: Sub-Second Diffusion Sensitive MR Imaging Using a Modified Fast Spin Echo Acquisition Mode*, by Fritz Schick in *Magnetic Resonance in Medicine,* 1997, Vol. 38, Pages 638-644. However, the method of Schick is limited to using a single echo train for image construction because the method requires phase consistency between echoes. Consequently, the method of Schick cannot produce high quality images.

Accordingly, there exists a need in the art of magnetic resonance imaging for, among other things, a technique that allows diffusion weighted imaging to be combined with fast spin echo imaging. The present inventors have determined that it would be particularly beneficial to provide a fast spin echo method that does not require the CPMG condition, as, e.g., such a method could allow fast spin echo techniques to be combined with diffusion imaging or diffusion weighting without problems of artifacts. Also, the present inventors have determined that it would be beneficial to provide a CPMG insensitive method that does not require phase consistency between echo trains. Also, the present inventors have determined that it would be an advance to provide a fast spin echo technique that does not require discarding ½ the echo signal.

Diffusion weighted imaging creates another problem, as well. The diffusion pulses are very powerful and produce macroscopic motion and mechanical vibrations in the MRI apparatus. Macroscopic motion degrades the image quality and creates artifacts. To obtain quality MRI images, the effect of macroscopic motion and vibrations must be reduced.

In the art, hybrid radial-Cartesian (HRC) image reconstruction techniques are known for generating MRI images utilizing k-space data. One such technique is known as "PROPELLER", and is described in U.S. Pat. No. 6,882,148 to Pipe and *Multishot Diffusion-Weighted FSE Using PROPELLER MRI*, by Pipe J G, Farthing V G, Forbes K P in *Magnetic Resonance in Medicine,* 2002, vol. 47, pages 42-52, and *Motion Correction With PROPELLER MRI, Application to Head Motion and Free Breathing Cardiac Imaging,* by Pipe J G, *Magnetic Resonance In Medicine,* 1999, vol. 42, Pages 963-969. In the PROPELLER technique, each received echo train corresponds to a set of lines in k-space having a unique radial orientation. Imaging data acquisition is completed when k-space is filled with many radially-oriented lines.

Hybrid radial-Cartesian reconstruction techniques such as the PROPELLER method are effective for minimizing the effects of macroscopic motion and vibrations created by the diffusion pulses. Accordingly, HRC techniques can provide benefits when diffusion weighted imaging is being performed.

The present inventors have determined that it would be particularly beneficial to provide an imaging method that is robust when exposed to the combination of macroscopic motion, vibrations, phase disruption and destruction of the CPMG condition caused by diffusion pulses and that such a method could be widely used in MRI.

SUMMARY

The preferred embodiments of the present invention provide a fast spin echo magnetic resonance imaging method. In the preferred embodiments of the present method, at least one spin echo pair is generated (for example by a 180 degree refocusing pulse), from at least two echo trains. The echo trains are acquired at different angled in k-space. Each echo pair has a first echo and a second echo. The first echo and second echo are separated in time. Each echo pair preferably has a unique phase encoding.

Using the first echoes, a first preliminary image is created by hybrid radial-Cartesian construction. The first preliminary image is created without using data from the second echoes.

Using the second echoes, a second preliminary image is created by hybrid radial-Cartesian construction. The second preliminary image is created without using data from the first echoes.

Then, the first and second preliminary images are combined, for example by weighted averaging, or root-mean-square averaging techniques. The preferred embodiments of the present method are insensitive to CPMG violation because the first and second echoes are processed independently. Independent processing of the first and second echoes is a notable aspect of the preferred embodiments of the present invention. The CPMG condition can be violated in the present invention. Also, the method can be used with multiple echo trains that do not share phase consistency. This beneficial aspect is a result of using hybrid radial-Cartesian construction techniques to generate the images.

Optionally, diffusion gradient pulses can be applied before the spin echo pairs are generated.

The spin echoes can be split into pairs by adjustment (in magnitude or duration) of an initial readout gradient pulse. Preferably, the echo pairs are split such that the first echo occurs after ¼ of a corresponding readout gradient pulse (or data sampling window), and the second echo occurs after ¾ of the corresponding readout gradient pulse (or data sampling window). Also, preferably the spin echoes of each echo pair are symmetrically displaced from a midpoint of the corresponding readout gradient pulse.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

DESCRIPTION OF THE DRAWINGS

The preferred embodiments of the present invention are shown by way of example, and not limitation, in the accompanying figures, in which.

DESCRIPTION OF THE PREFERRED EMBODIMENTS

While the present invention may be embodied in many different forms, there is described here detailed illustrative embodiments with the understanding that the present disclosure is to be considered as an example of the principles of the invention and is not intended to limit the invention to the illustrated embodiments.

The preferred embodiments of the present invention provide a fast spin echo imaging method that is insensitive to violations of the Carr Purcell Meiboom Gill (CPMG) condition. The preferred embodiments of the present invention provide a combination of fast spin echo imaging and hybrid-radial Cartesian (HRC) image construction techniques. In the preferred embodiments of the present invention, an echo train is generated by a series of 180 degree refocusing pulses. Each echo in the train is split into an echo pair comprising first and second echoes. The echo splitting is created by adjusting the magnitude of readout gradients. Each echo pair in the echo train has a unique phase encoding. The first echoes are used to create a first preliminary image by HRC methods, and the second echoes are used to create a second preliminary image by HRC methods. In a final step, the first and second preliminary images are combined (e.g. by weighted averaging) to create a final image. In the preferred embodiments, because the group of first echoes and the group of second echoes are processed independently, the effects of phase disruption and CPMG violation (caused by the diffusion pulses) are avoided. Because HRC is used for image construction, phase consistency between echo trains is not required. Also, the benefits of HRC (e.g. insensitivity to vibrations and macroscopic movement) are preserved.

The preferred embodiments provide high signal strength because the entire magnetization can be utilized. In particular, splitting of the echo train into two signals allows the entire magnetization to be used. The echo signal is split along the readout direction (i.e. the echo signals are split by the readout gradient). In this way, both components of the magnetization in the XY plane (i.e. the plane perpendicular to the MRI magnetic field direction) are treated equally and no artifacts are introduced due to the violation of the CPMG condition. Also, splitting the two echoes allows the effective picture element (i.e., pixel) bandwidth to be reduced and allows the spatial resolution to be increased.

The preferred embodiments of the present invention can be carried out using any conventional magnetic resonance imaging apparatus. A conventional MRI apparatus will have a uniform field magnet, gradient coils, RF excitation coils, RF acquisition coils for detecting spin echoes, RF generator and receiver circuits for generating and detecting RF signals and a computer for calculating the image. These components are employed in carrying out preferred embodiments of the present invention. Conventional MRI apparatus are well known in the art.

For reference, in the preferred embodiments, the following terminology can be employed:

Readout Gradient: Magnetic field gradient applied during reception of spin echoes. Readout gradient is applied in the readout direction.

Diffusion Gradient: Magnetic field gradient applied to facilitate imaging or measurement of rate of diffusion. Typically, the diffusion gradient is applied before reception of spin echoes.

Carr Purcell Meiboom Gill (CPMG) condition: When there exists an exact and consistent phase relation between the transversal magnetization and the phase of the refocusing RF pulses.

Fast Spin Echo: Family of MRI imaging techniques in which a single excitation RF pulse and plurality of refocusing pulses (e.g. 180 degree pulses) are used to generate a plurality of spin echoes. Typically, the number of spin echoes is the same as the number of refocusing pulses. Also typically, each spin echo is spatial encoded in a direction perpendicular to the readout direction by a different amount, by applying phase encoding pulses before and after each spin echo.

Hybrid Radial Cartesian Reconstruction: A method of image reconstruction from multiple sets of Cartesian data [parallel lines through k-space] taken at varying radial angles to cover the k-space; i.e. approximately 180 degrees of radial variation with sufficient angular density as is known in the art.

Figure 1:
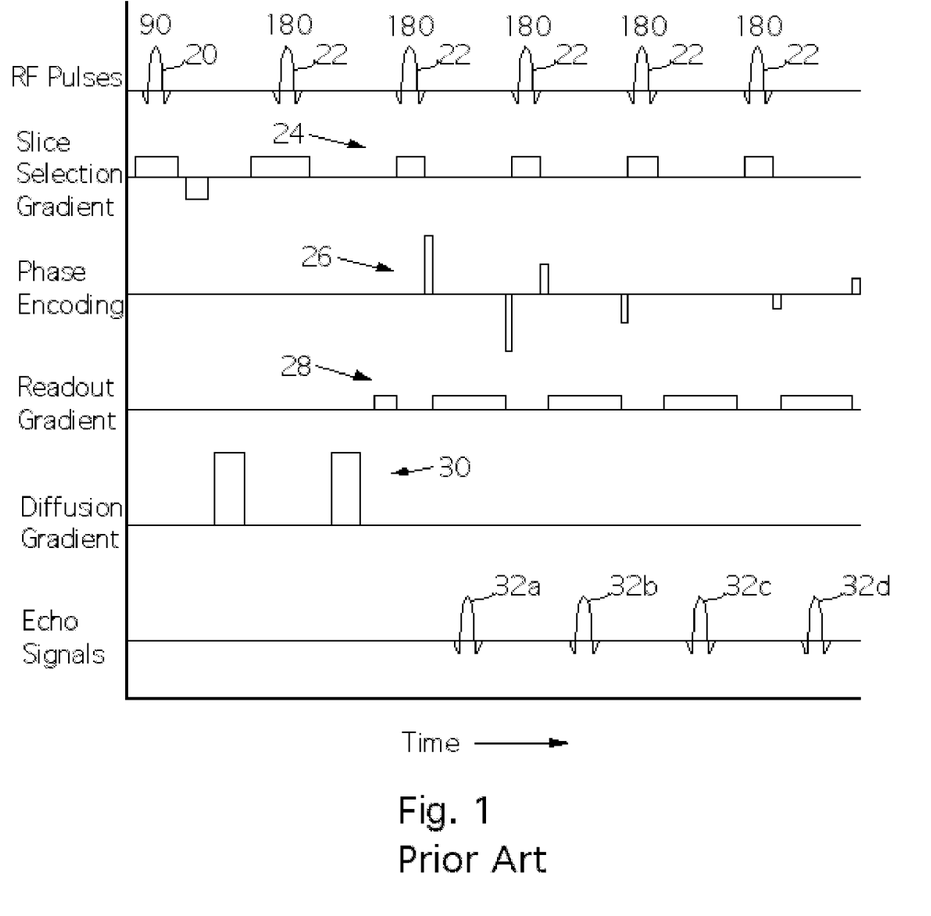
FIG. 1 (Prior Art) shows a sequence diagram for a conventional fast spin echo method with diffusion imaging.

FIG. 1 shows a sequence diagram for a conventional fast spin echo MRI technique with diffusion imaging or diffusion weighted imaging. The method of FIG. 1 employs well known 90 degree excitation pulse 20 and 180 degree refocusing pulses 22. The refocusing pulses 22 create a train of spin echoes 32*a*, 32*b*, 32*c*, 32*d*, as known in the art. Slice selection gradient pulses 24 determine the slice that is imaged, as well known in the art. Phase encoding pulses 26 produce a unique phase for each spin echo 32*a* 32*b* 32*c* 32*d*, as also known in the art. Phase encoding pulses are applied in matched pairs before and after each spin echo. Readout gradient pulses 28 impose a magnetic field gradient while the spin echoes 32 are being received. Diffusion gradient pulses 30 create strong magnetic field gradients that allow the measurement of diffusion within the imaged slice. Typically, the diffusion rate of water is measured.

In the prior art method of FIG. 1, it is necessary for the overlapping echo components (in each spin echo 32*a* 32*b* 32*c* 32*d*) to precisely overlap. If the overlapping echo components do not overlap precisely, then the resulting image will have undesirable artifacts. CPMG condition violations tend to cause the echo components to overlap in erroneous ways. This is a significant mechanism by which CPMG violation causes problems in fast spin echo imaging. In prior art methods it is necessary for the single echo train to contain all the echoes needed for a full resolution image. In other words, all the echoes must be derived from a single excitation.

Figure 2:
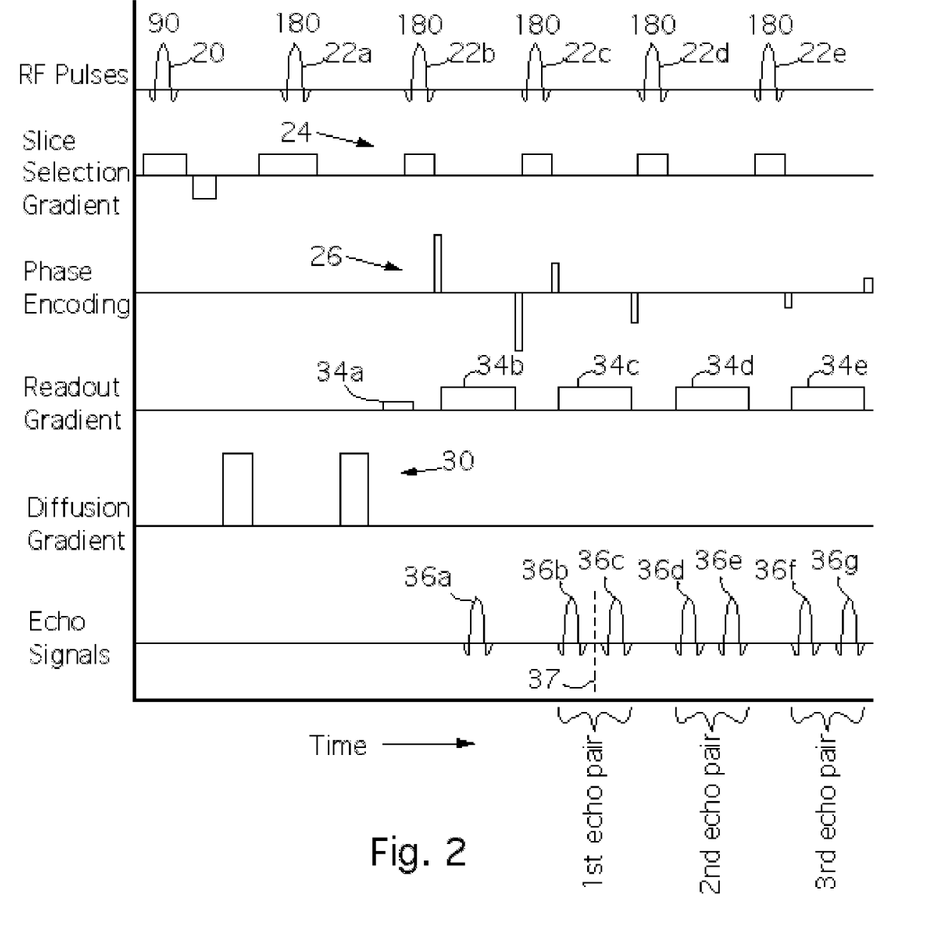
FIG. 2 shows a sequence diagram according to the preferred embodiments of the present invention.

FIG. 2 shows a sequence diagram according to the preferred embodiments of the present invention. The 90 degree excitation pulse 20, 180 degree refocusing pulses 22, slice selection gradient pulses 24, phase encoding pulses 26 and diffusion gradient pulses 30 can be substantially the same as in the prior art. In the preferred embodiments, an initial readout gradient pulse 34*a* is adjusted in magnitude or duration such that spin echo signals are each split into echo pairs. FIG. 2 illustrates 3 echo pairs.

It is noted that an initial spin echo 36*a* is not split because it comprises a single echo component. The initial spin echo 36 will not be split for any magnitude or duration value of the readout gradient pulse 34*a*. Echoes 36*b*+36*c* comprise an echo pair (created by refocusing pulse 22*c*), echoes 36*d*+36*e* comprise an echo pair (created by refocusing pulse 22*d*), and echoes 36*f*+36*g* comprise an echo pair (created by refocusing pulse 22*e*). Echoes 36*b*, 36*d*, 36*f* are 'first' echoes; echoes 36*c*, 36*e*, 36*g* are 'second' echoes. Each of the echoes 36*b*-36*g* comprises approximately 50% of the echo components of the pair.

In a typical application of the preferred embodiments, there may be, e.g., dozens or hundreds of spin echo pairs. In order to create an image, at least one echo pair is required. More typically, at least 2, 8, 12, 15, or 20 echo pairs will generally be used. However, for clarity, only 3 spin echo pairs are illustrated in FIG. 2.

In order to cause splitting of the spin echoes into pairs, the initial readout gradient 34*a* should be adjusted. The amount of echo splitting (i.e., the time duration between echoes comprising an echo pair) can be accurately adjusted by changing the magnitude or duration of only the initial readout gradient pulse 34*a* (and leaving the subsequent readout gradient pulses 34*b* 34*c* 34*d* unchanged). Preferably, the echo pairs are split sufficiently such that they do not significantly overlap or interfere. This aspect of the preferred embodiments of the present invention is further described below.

Preferably, the echoes comprising an echo pair are symmetrically displaced from a center time 37. The center time 37 is defined as the time at which a spin echo would occur in the absence of echo splitting (i.e. the midpoint between refocusing pulses 22). Preferably, the center time 37 occurs halfway through the corresponding readout gradient pulse 34*c*. Also preferably, the center time 37 occurs at the midpoint of a data sampling window (not shown) during which data is received. However, the data sampling window can be moved relative to the center time 37.

Figure 3:
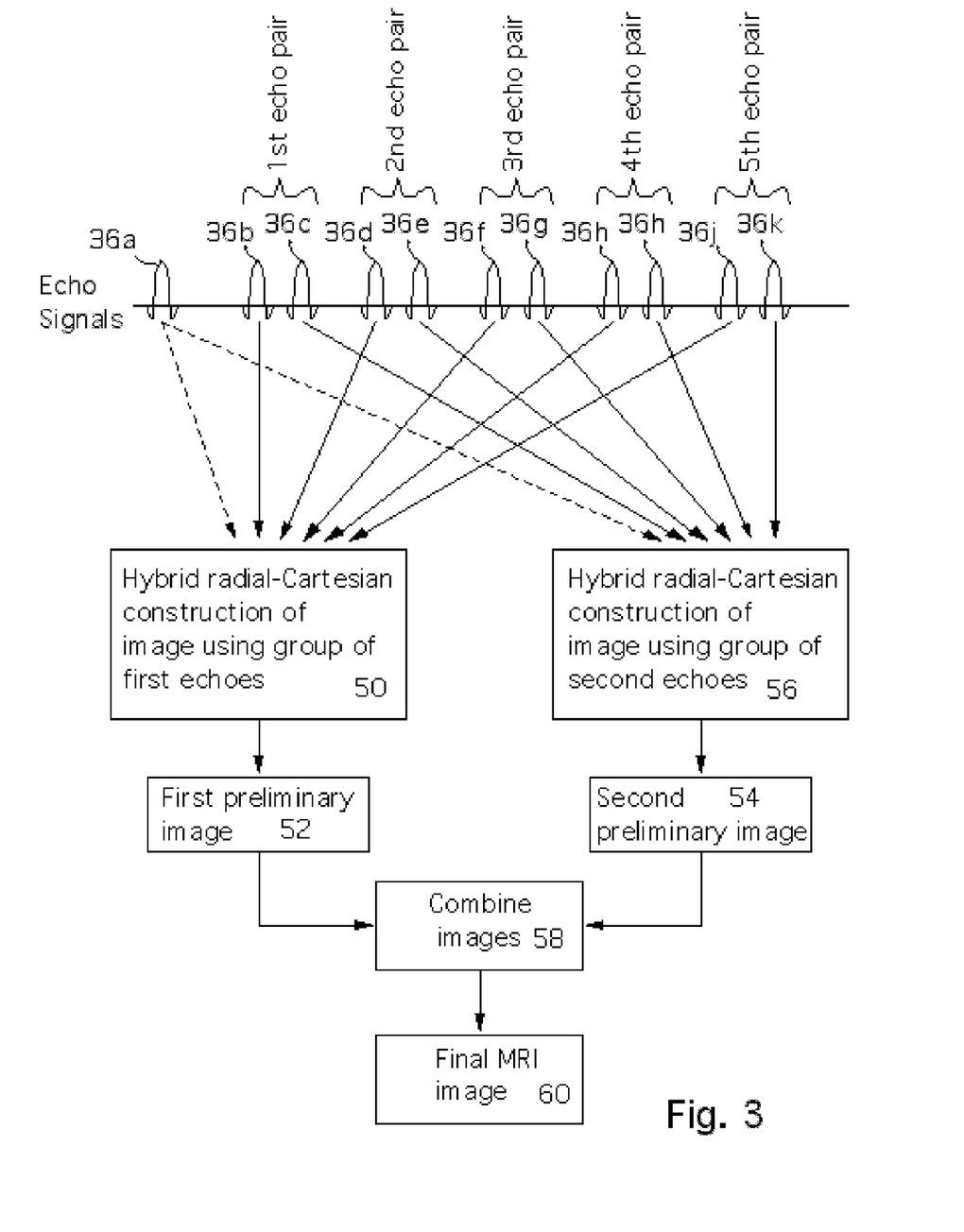
FIG. 3 shows a schematic illustration of the method of the preferred embodiments of the present invention.

FIG. 3 schematically illustrates the present fast spin echo imaging technique in which 5 spin echo pairs are used. In the preferred embodiments of the present invention, the first echoes 36*b*, 36*d*, 36*f*, 36*h*, 36*j* are processed into an image independently of the second echoes 36*c*, 36*e*, 36*g*, 36*h*, 36*k*. Similarly, the second echoes 36*c*, 36*e*, 36*g*, 36*h*, 36*k* are processed into an image independently of the first echoes 36*b*, 36*d*, 36*f*, 36*h*, 36*j*. In particular, the first echoes 36*b*, 36*d*, 36*f*, 36*h*, 36*j* are used to generate a first preliminary image 52 by a hybrid radial-Cartesian construction step 50. Similarly, the second echoes 36*c*, 36*e*, 36*g*, 36*h*, 36*k* are used to generate a second preliminary image 54 by a hybrid radial-Cartesian construction step 56. The use of the initial, unsplit spin echo 36*a* is optional. It may or may not be used in generating the first and second preliminary images 52 54, as indicated by the dashed lines. The initial spin echo 36*a* may be discarded in some embodiments of the present invention. If only one echo pair is used for generating an image, then the initial, unsplit echo 36*a* should be used for image construction.

The desired number of echo pairs will depend on the performance of the system hardware, number of blades, and object being imaged. At least one echo pair is required in each echo train. However, preferably at least 4, 8, 10, 15 or 20 echo pairs are present in each echo train.

For simplicity, FIG. 3 illustrates echo pairs from a single echo train. However, in the present invention, multiple echo trains will be used to generate an image. This is accomplished in the manner illustrated in FIG. 3. Specifically, the first echoes from the multiple echo trains are process together (i.e. in step 50), and the second echoes from the multiple echo trains are processed together (i.e. in step 56).

After the first and second preliminary images 52 54 are created, they are combined in step 58 to produce a final image 60. Optionally, diffusion weighting can be performed. The diffusion weighting will rely on diffusion measurements obtained from the diffusion gradient pulses 30. The preliminary images can be combined using a root-mean-square normalization technique (e.g. in which each pixel value is squared before images are combined). Other well known image combination, weighted averaging and normalization methods can also be used.

It is also noteworthy that the hybrid radial-cartesian construction steps 50 56 of the preferred embodiments completely removes phase and timing information present in the echoes. Consequently, phase and timing information will not create interference effects and consequent artifacts in the preliminary images 52 54 or final image 60. The desirable insensitivity of the preferred embodiments of the present invention to CPMG violation is a result of the independent processing of the first echoes 36b, 36d, 36f, 36h, 36j and the second echoes 36c, 36e, 36g, 36h, 36k. Accordingly, the independent processing of first and second echo groups into first and second preliminary images allows fast spin echo techniques to be combined with diffusion gradient pulses without fear of creating undesirable artifacts. The independent processing of first and second echo groups thereby provides unique and desirable advantages in the preferred embodiments of the present invention. Also, the HRC techniques allow echoes from multiple echo trains to be used in combination, without requiring phase consistency between echo trains. The ability to use multiple echo trains that do not have phase consistency allows high quality images to be generated.

The use of the HCR construction technique in the present invention allows the use of many echo trains. Data from many echo trains can be combined, and consequently the resolution of the final image can be much greater than that possible in cases where a single echo train is used. Multiple echo trains can be used and combined because the HCR construction technique is insensitive to the phase mismatch between echo trains.

The hybrid radial-Cartesian construction method in steps 50 56 is preferably the well known PROPELLER method disclosed in U.S. Pat. No. 6,882,148 to Pipe, the disclosure of which is incorporated herein by reference in its entirety. However, other, non-PROPELLER type hybrid radial-Cartesian image construction methods can also be used. Generally, in alternative embodiments of the present invention, any hybrid radial Cartesian construction can be used. Preferably, the image construction technique employs radially arranged data blades in k-space (frequency domain). The PROPELLER method, for example, employs radially-arranged data blades in k-space.

Figure 4:
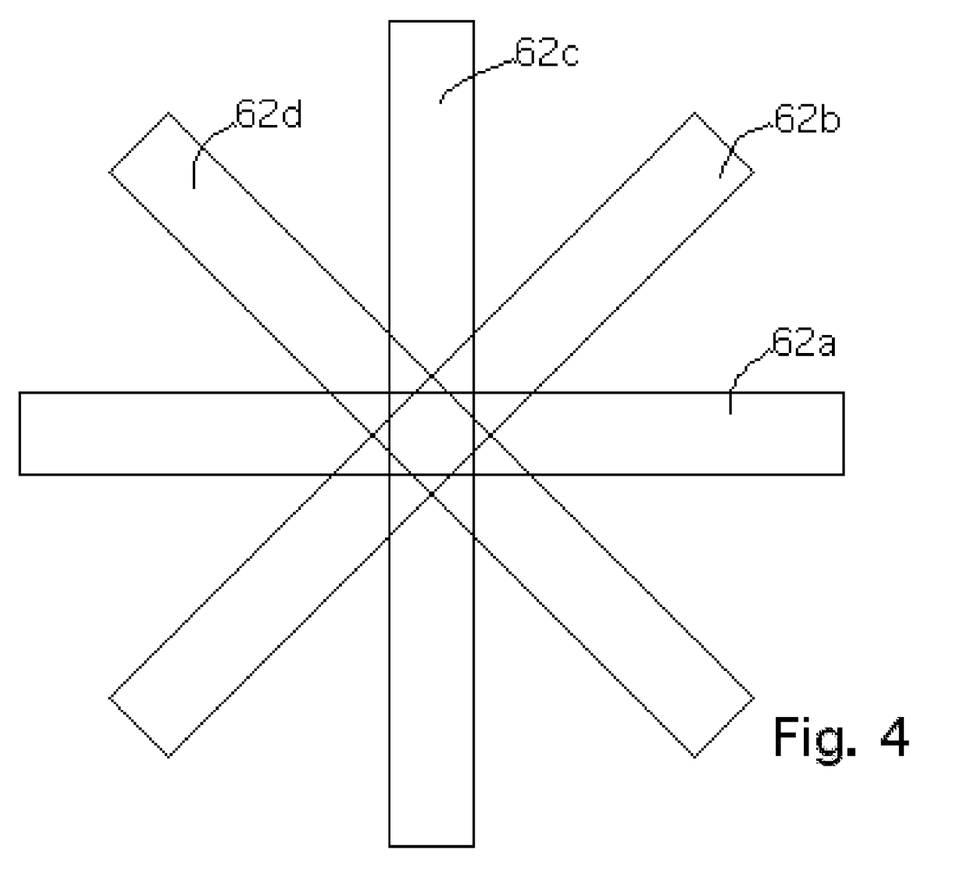
FIG. 4 shows a data set in k-space obtained from 4 echo trains. Each echo train is acquired at a different angle.

FIG. 4 shows a data set comprising radially arranged data blades in k-space (frequency space) for constructing an image by a hybrid radial-Cartesian image construction. Each blade 62a 62b 62c 62d corresponds to a different echo train. In other words, each echo train produces one blade 62. Each echo train is acquired at a different angle, and consequently, each blade has a different angle in k-space. Hence, the data set of FIG. 4 is created from 4 echo trains. The width of each blade corresponds to the number of echo pairs in an echo train (more echo pairs, and hence wider blade are preferred for better image resolution). In the preferred embodiments, the first preliminary image is created from a data set in k-space, and the second preliminary image is created from a separate data set in k-space. The data sets used to create the first and second preliminary images are independent and comprise different data.

When the image formation algorithm is the hybrid radial-Cartesian type, there is an amount of sampling that is required to adequately represent the fine resolution structures that depends on the size of the image matrix. This is described in the references on PROPELLER (e.g. U.S. Pat. No. 6,882,148 to Pipe and *Multishot Diffusion-Weighted FSE Using PROPELLER MRI*, by Pipe J G, Farthing V G, Forbes K P in *Magnetic Resonance in Medicine* 47:42-52 (2002), and *Motion Correction With PROPELLER MRI, Application to Head Motion and Free Breathing Cardiac Imaging*, by Pipe J G, *Magnetic Resonance In Medicine*, 1999, vol. 42, Pages 963-969). For an image with radial matrix Mo (isotropic case), the product of the number of blades [nB] and the number of lines in each blade [nL] must equal or exceed Mo*pi/2. This is called the Nyquist condition to prevent aliasing. This assumes that the blades are distributed uniformly over radial angles covering 180 degrees of view.

There is no sharp minimum for the amount of data but the amount recommended as minimum will reduce the severity of the familiar radial streaking artifacts. Images can be formed with fewer data points.

There is no sharp minimum to the number of lines per blade either. Fewer lines in each blade means that the area of mutual overlap of the blades is reduced. This makes for less data to perform the motion correction algorithms that are possible using this type of data, as described in PROPELLER references identified above. From a practical standpoint the method will probably not work adequately for high resolution applications with fewer than 8 lines per blade. It will do measurably better with 12 or 16 or more.

In the preferred embodiments of the present invention, the amount of echo splitting (i.e., the time delay between echo pairs) is preferably accurately controlled, as noted above. The echoes of each echo pair must be fully separated in order to avoid undesirable interference effects. In order to produce echo splitting, a ratio RO1/RO2 needs to be unequal to (i.e., greater than or lesser than) a critical value that produces zero echo splitting. The quantity RO1 is the integral (magnitude times duration) of the initial; readout gradient 34a; the quantity RO2 is the integral (magnitude times duration) of the subsequent readout gradients 34b 34c 34d 34e (which are typically identical). In a typical application of the present invention, the value of RO1 can be about ½ of the value of RO2.

Figure 5:
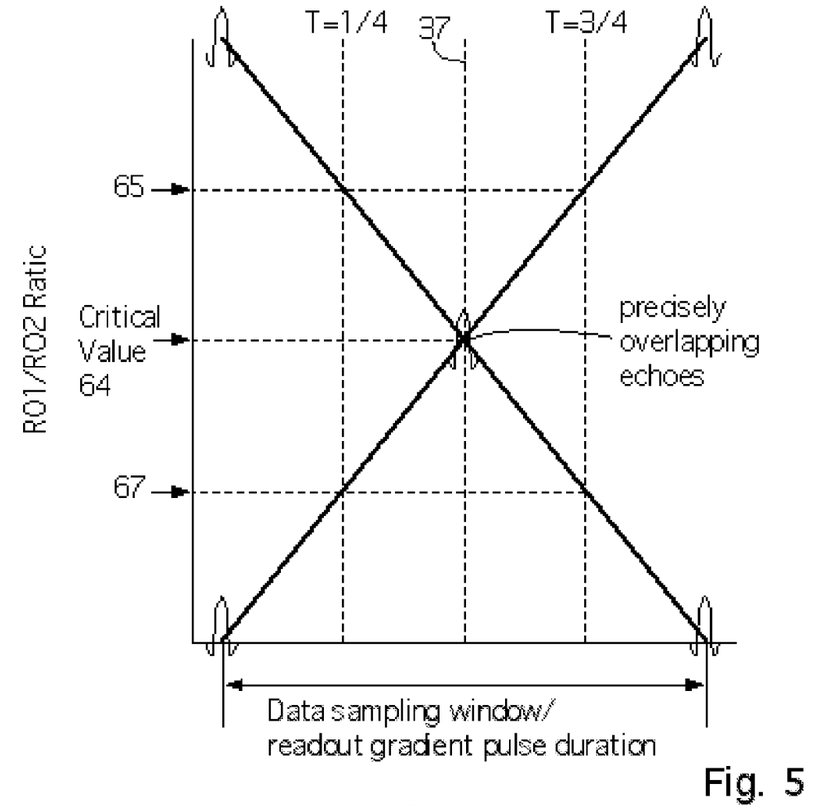
FIG. 5 illustrates how the amount of echo splitting can be adjusted by changing a ratio of RO1/RO2.

FIG. 5 shows a plot illustrating the dependence of echo splitting on the ratio RO1/RO2. When the ratio RO1/RO2 is equal to a critical value 64, there is zero echo splitting. In conventional fast spin echo imaging, the ratio RO1/RO2 is selected to equal the critical value 64, such that zero echo splitting occurs (i.e., such that the echo components are precisely overlapping). The preferred embodiments of the present invention deliberately violate this conventionally desirable condition. Echo splitting is a notable aspect of the preferred embodiments of the present invention. Practically, echo splitting can be accomplished by adjusting the magnitude or duration (or both) of the initial readout gradient pulse 34a to a small or large value. Small values and large values are equivalent in the preferred embodiments of the present invention, and produce essentially the same amount of echo splitting (as measured by a time delays between echo pairs).

As illustrated in FIG. 5, echo splitting increases monotonically as the ratio RO1/RO2 deviates from the critical value 64. Both high and low values of the ratio RO1/RO2 can produce equivalent, arbitrary amounts of echo splitting. Both high and low values of the ratio RO1/RO2 can be used in the preferred embodiments of the present invention.

In the preferred embodiments, it is preferred for the echo pairs to be split such that the echoes occur at times T=¼ and T=¾, as illustrated in FIG. 5. There are two values 65 67 of the ratio RO1/RO2 that produce echoes at T=¼ and T=¾.

Times T=¼ and T=¾ are defined in terms of the data sampling window. Typically, the data sampling window will overlap with the readout gradient. Specifically, T=¼ is the moment in time after ¼ of the data sampling window, and T=¾ is the moment in time after ¾ of the data sampling window. This amount of echo splitting is preferred because it maximizes the amount of splitting, while avoiding truncation of the echoes. Truncation of the echoes will occur if the echoes extend beyond the data sampling window. In other words, echo signal that occurs before or after the data sampling window will not be usable. Hence, excessive echo splitting will result in echo truncation and signal loss.

Although echoes at times T=¼ and T=¾ is preferred, the present invention and the appended claims are not so limited. In fact, in the present invention, the echo pairs can have any amount of splitting (i.e. any splitting that results in T≠½). Other amounts of echo splitting are included in the present invention. For example, echo splitting of T=0.05 and T=0.95, or T=⅓ and T=⅔, or T=⅖ and T=⅗ are also within the scope of the present invention.

Although the relationship between the ratio RO1/RO2 and the echo splitting is illustrated as linear in FIG. 5, it is not necessarily linear. The relationship between the ratio RO1/RO2 and echo splitting can also be nonlinear.

Figure 6:
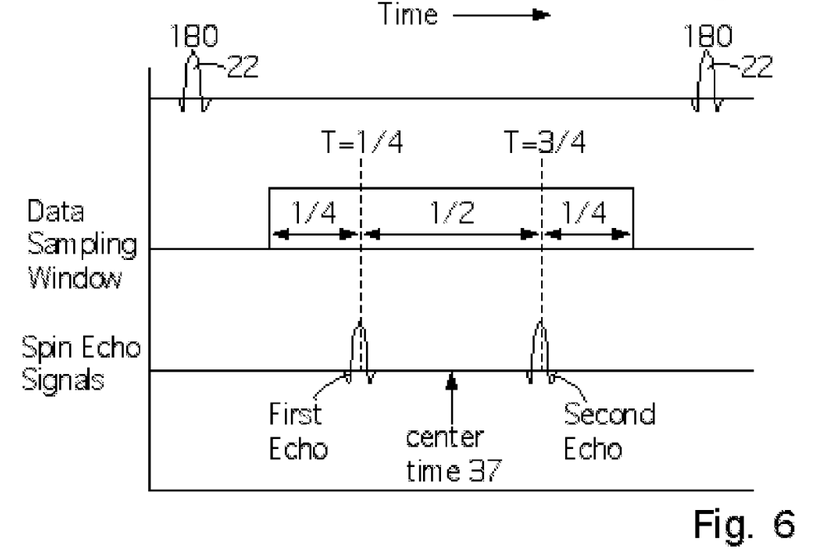
FIG. 6 shows a partial sequence diagram illustrating echoes at T=¼ and T=¾.

FIG. 6 shows a partial sequence diagram illustrating a single echo pair having echoes at T=¼ and T=¾. The center time 37 is defined as the time at which a spin echo would occur in the absence of echo splitting (i.e. the midpoint between refocusing pulses 22). Preferably, the center time 37 is at the midpoint of the data sampling window. However, the data sampling window can be moved so that the center time is not in the middle of the data sampling window. Typically, the data sampling window will overlap with the readout gradient pulse.

Also, it is noted that greater splitting of the echoes will generally result in greater spatial resolution in the MRI image. This is because greater splitting will allow detection of high spatial frequency components in the echoes. For generating images with exceptional spatial resolution, the echoes can be split wider than T=¼ and T=¾. For example, the echoes can have a splitting of T=1/10 and T=9/10 in cases where high spatial resolution is desired.

The present invention can be ungated. Ungated operation tends to reduce the time required for object preparation, as known in the art.

EXAMPLE

An exemplary imaging method according to an illustrative embodiment of the present invention was implemented in a TOSHIBA 0.35T ULTRA scanner. A standard fast spin echo sequence was modified to acquire in the 'propeller' mode. The diffusion preparation segment involved a spin echo and the diffusion gradient pulse pair. Its TE point marked the beginning of the fast spin echo (i.e. repeating 180° pulses) sequence in the split mode. The data from each readout period was split into two echoes and each was stored into two separated memory areas and reconstructed separately as if each was a complete data set. Finally, the resulting two images were added magnitude-wise for display.

In this illustrative and non-limiting example, the sequence parameters were:
  ST=6 mm (slice gap=1.2), (where ST stands for slice thickness);
  NS=12, (where NS stands for number of slices);
  pe matrix=read matrix=256;
  FOVpe=FOVro=25.6 cm, (where FOV stands for Field of View);
  echo-train length=21 with an echo separation=11 ms;
  TE[effective]=100 ms, (where TE stands for echo time);
  TR=4000 ms, (where TR stands for repetition time);
  total acquisition time=3:16 [min:sec]

Two reconstruction methods were used for comparison: a first method described in Jackson et al, IEEE Transactions on Medical Imaging 10:473-478 (1991) and a second method described in B. Desplanques et al, IEEE Transaction on Nuclear Science 49:2268-2273 (2002).

The first (Jackson) reconstruction algorithm performs a direct solution of the equation $$s(k)=\Sigma_r \rho(r) \exp(2\pi i r k),$$

where $\rho(r)$ is the unknown image, and $s(k)$ is the acquired data, and involves four steps:
1. Density compensation of $s(k)$.
2. Convolution resampling of the density compensated data onto an equispaced Cartesian grid.
3. Fast Fourier transform of the resampled data.
4. Correction for the apodization, created by the convolution kernel in step 2.

The second (B. Desplanques) algorithm performs the iterative numerical solution of the above equation. The process of iteration involves gradually adjusting $\rho(r)$ using the conjugate gradient method, until the $m^{th}$ iteration $s_m(k)$ calculated by $$s_m(k)=\Sigma_n \rho(r_n) \exp(2\pi i r_n k),$$

is near enough (by a certain norm) to the acquired data. Calculation of the sum is done by the method, described in Potts D, Steidl G, and Tasche M. *Fast Fourier Transform for Nonequispaced Data: A tutorial in Modern Sampling Theory: in Mathematics and Applications*, J. Benedetto and P. Ferreira, eds., 1998, chapter. 12, pp. 249-274. In fact, the first iteration with the zero vector $\rho(r)$ as the initial guess, gives (to within a constant) the optimized Jackson's gridding solution.

The preferred embodiments of the present invention provide a combination of hybrid radial-Cartesian construction and fast spin echo in the split-mode. The preferred embodiments of the present invention generate high resolution diffusion images with good signal-to-noise ratios, free of motion artifacts, and with consistent image quality overall. Jackson and B. Desplanques reconstruction (described above) with one iteration offer similar levels of contrast and uniformity. The use of a split echo train in the readout axis makes the echo train signal much more stable in the presence of motion, in cases where the RF refocus pulse is mis-adjusted, and especially in the case where there are large gradients applied for diffusion weighting of the image contrast. For instance, other conventional methods that use specific phase patterns require a fairly accurate setting of the flip angle to 180 degrees. In the preferred embodiments, because the phase information is separately processed for each echo group (i.e. because first and second echoes are processed independently), there is no difficulty with phase cancellation artifacts such as shading. The full signal to noise ratio is maintained, as distinct from methods that spoil away (i.e. discard) one of the interfering echo trains.

Broad Scope of the Invention:

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure, the following abbreviated terminology may be employed: "e.g." which means "for example."

What is claimed is:

1. A fast spin echo magnetic resonance imaging method, comprising the steps of:
    a) generating at least one echo pair in parallel from each of at least two echo trains, wherein each echo pair has a first echo and a second echo occurring at different times, and wherein each echo train is acquired at a different angle in k-space;
    b) using the first echoes, creating a first preliminary image using a hybrid radial-Cartesian construction technique, wherein the first preliminary image is created without using data from the second echoes;
    c) using the second echoes, creating a second preliminary image using a hybrid radial-Cartesian construction technique, wherein the second preliminary image is created without using data from the first echoes; and
    d) combining the first and second preliminary images.

2. The fast spin echo imaging method of claim 1, further comprising the step of applying diffusion gradient pulses before step (a).

3. The fast spin echo imaging method of claim 1, wherein the Carr Purcell Meiboom Gill (CPMG) condition is violated.

4. The fast spin echo imaging method of claim 1, wherein the Carr Purcell Meiboom Gill (CPMG) condition is violated by at least 20 degrees.

5. The fast spin echo imaging method of claim 1, wherein the first and second preliminary images are combined by weighted averaging.

6. The fast spin echo imaging method of claim 1, wherein the echo pairs are split by adjustment in magnitude or duration or both of an initial readout gradient pulse, and wherein the initial readout gradient pulse is applied before step (a).

7. The fast spin echo imaging method of claim 1, wherein each echo pair comprises echoes at approximately $T=\frac{1}{4}$ and $T=\frac{3}{4}$.

8. The fast spin echo imaging method of claim 1, wherein each echo pair comprises echoes that are symmetrically displaced from a midpoint of a data sampling window.

9. The fast spin echo imaging method of claim 1, wherein each echo pair comprises echoes that are symmetrically displaced from a center time.

10. A fast spin echo magnetic resonance imaging method, comprising the steps of:
    a) generating at least one echo pair in parallel from each of at least two echo trains, wherein each echo pair has a first echo and a second echo occurring at different times, and wherein each echo train is acquired at a different angle in k-space;
    b) using the first echoes, creating a first preliminary image using a hybrid radial-Cartesian construction technique, wherein the first preliminary image is created without using data from the second echoes;
    c) using the second echoes, creating a second preliminary image using a hybrid radial-Cartesian construction technique, wherein the second preliminary image is created without using data from the first echoes; and
    d) combining the first and second preliminary images,
    wherein a ratio RO1/RO2 is at least about 55% greater than or at more about 55% smaller than a critical value that produces zero echo splitting.

11. A fast spin echo magnetic resonance imaging method, comprising the steps of:
    a) applying diffusion gradient pulses;
    b) generating a train of at least one echo pair in parallel from each of at least two echo trains, wherein each echo pair has a first echo and a second echo occurring at different times, and wherein each echo train is acquired at a different angle in k-space;
    c) using the first echoes, generating a first preliminary image using a hybrid radial-Cartesian construction technique;
    d) using the second echoes, generating a second preliminary image using a hybrid radial-Cartesian construction technique; and
    e) combining the first and second preliminary images.

12. The fast spin echo imaging method of claim 11, wherein the Carr Purcell Meiboom Gill (CPMG) condition is violated.

13. The fast spin echo imaging method of claim 11, wherein the Carr Purcell Meiboom Gill (CPMG) condition is violated by at least 20 degrees.

14. The fast spin echo imaging method of claim 11, wherein the first and second preliminary images are combined by weighted averaging.

15. The fast spin echo imaging method of claim 11, wherein the echo pairs are split by adjustment in magnitude or duration or both of an initial readout gradient pulse, and wherein the initial readout gradient pulse is applied before step (a).

16. The fast spin echo imaging method of claim 11, wherein each echo pair comprises echoes at approximately $T=\frac{1}{4}$ and $T=\frac{3}{4}$.

17. The fast spin echo imaging method of claim 11, wherein each echo pair comprises echoes that are symmetrically displaced from a midpoint of a data sampling window.

18. The fast spin echo imaging method of claim 11, wherein each echo pair comprises echoes that are symmetrically displaced from a center time.

19. A fast spin echo magnetic resonance imaging method, comprising the steps of:
   a) applying diffusion gradient pulses;
   b) generating a train of at least one echo pair from each of at least two echo trains, wherein each echo pair has a first echo and a second echo occurring at different times, and wherein each echo train is acquired at a different angle in k-space;
   c) using the first echoes, generating a first preliminary image using a hybrid radial-Cartesian construction technique;
   d) using the second echoes, generating a second preliminary image using a hybrid radial-Cartesian construction technique; and e) combining the first and second preliminary images,
   wherein a ratio RO1/RO2 is at least about 55% greater than or at most about 55% smaller than a critical value that produces zero echo splitting.

* * * * *